US011838017B2

(12) United States Patent
Harrison et al.

(10) Patent No.: US 11,838,017 B2
(45) Date of Patent: Dec. 5, 2023

(54) GALLIUM NITRIDE BI-DIRECTIONAL HIGH ELECTRON MOBILITY TRANSISTOR SUBSTRATE VOLTAGE MANAGEMENT CIRCUIT

(71) Applicant: Enphase Energy, Inc., Petaluma, CA (US)

(72) Inventors: Michael J. Harrison, Petaluma, CA (US); Christiaan Johannes van Antwerpen, Mountain View, CA (US); Patrick Lyle Chapman, Austin, TX (US)

(73) Assignee: Enphase Energy, Inc., Petaluma, CA (US)

( * ) Notice: Subject to any disclaimer, the term of this patent is extended or adjusted under 35 U.S.C. 154(b) by 0 days.

(21) Appl. No.: 17/846,882

(22) Filed: Jun. 22, 2022

(65) Prior Publication Data

US 2022/0416784 A1 Dec. 29, 2022

Related U.S. Application Data

(60) Provisional application No. 63/215,722, filed on Jun. 28, 2021.

(51) Int. Cl.
*H03K 17/687* (2006.01)
*H01L 29/778* (2006.01)
*H01L 29/20* (2006.01)

(52) U.S. Cl.
CPC ..... *H03K 17/6871* (2013.01); *H01L 29/2003* (2013.01); *H01L 29/7786* (2013.01)

(58) Field of Classification Search
CPC ............ H03K 17/6871; H01L 29/2003; H01L 29/7786
See application file for complete search history.

(56) References Cited

U.S. PATENT DOCUMENTS

| 7,982,240 | B2 | 7/2011 | Machida |
| 8,604,512 | B2 | 12/2013 | Morita |
| 10,348,295 | B2 * | 7/2019 | Dupuy ................. H03K 17/687 |
| 10,348,296 | B2 * | 7/2019 | Stefanov ............... H01L 29/086 |

(Continued)

FOREIGN PATENT DOCUMENTS

WO    WO 2012-154974 A1    11/2012

OTHER PUBLICATIONS

PCT International Search Report and Written Opinion for Application No. PCT/US2022/034208 dated Oct. 12, 2022, 9 pgs.

*Primary Examiner* — Metasebia T Retebo
(74) *Attorney, Agent, or Firm* — Moser Taboada

(57) ABSTRACT

Apparatus for performing substrate voltage management is provided herein and comprises an active substrate voltage management circuit configured to be coupled to a substrate of a bidirectional gallium nitride high electron mobility transistor comprising a first source and a second source. The active substrate voltage management circuit comprises a first circuit that is connected to the first source and a second circuit that is connected to a second source such that when the bidirectional gallium nitride high electron mobility transistor is operational one of the first circuit or the second circuit connects one of the first source to the substrate or the second source to the substrate, respectively, to control a bias voltage applied to the substrate.

20 Claims, 4 Drawing Sheets

(56) References Cited

U.S. PATENT DOCUMENTS

| | | |
|---|---|---|
| 2009/0065810 A1 | 3/2009 | Honea et al. |
| 2014/0084347 A1 | 3/2014 | Salcedo et al. |
| 2014/0374766 A1 | 12/2014 | Bahl et al. |
| 2019/0068181 A1* | 2/2019 | Leong ................ H01L 29/7787 |
| 2019/0190517 A1 | 6/2019 | Leong |
| 2019/0245452 A1 | 8/2019 | Portisch |
| 2019/0326280 A1* | 10/2019 | Imam ................ H01L 29/42316 |
| 2022/0385196 A1* | 12/2022 | Kanomata ........... H01L 29/7787 |

* cited by examiner (BACKGROUND)

(BACKGROUND)

GALLIUM NITRIDE BI-DIRECTIONAL HIGH ELECTRON MOBILITY TRANSISTOR SUBSTRATE VOLTAGE MANAGEMENT CIRCUIT

CROSS-REFERENCE TO RELATED APPLICATIONS

The present application claims the benefit of and priority to U.S. Provisional Application Ser. No. 63/215,722, filed Jun. 28, 2021, the entire contents of which is incorporated herein by reference.

BACKGROUND

Field of the Disclosure

Embodiments of the disclosure relate to gallium nitride (GaN) bidirectional high mobility transistors (HEMTs) and, in particular, substrate voltage management for bidirectional GaN HEMTs.

Description of the Related Art

Gallium Nitride (GaN) High Mobility Electron Transistor (HEMT) switches can be constructed as a native bi-directional switch (BDS), also known as a 4-Quadrant Switch (4QS), and as such a GaN HEMT 4QS device has higher performance at a lower cost than an equivalent 'back-to-back' pair of conventional uni-directional GaN HEMT devices as shown in FIG. 1.

A conventional uni-directional GaN High Electron Mobility Transistor (HEMT) is fabricated as a lateral device with the drift region between the drain and source connections being parallel to the top surface of the GaN die. A second gate-source structure can be used in place of the existing drain structure which facilitates a native bidirectional switch (4QS). This GaN HEMT native 4QS allows the common drift region to be used in either direction (S1→S2 or S2→S1), thereby providing a GaN area reduction compared to a conventional 4QS device fabricated by connecting two conventional GaN HEMT devices together. FIG. 2 shows a simplified structure for both unidirectional and bidirectional GaN HEMTs. The merged drain GaN HEMT native 4QS provides a 4:1 die area advantage compared to the pair of conventional unidirectional GaN HEMTs connected together to make a 4QS device.

The ratio of gate drive loss to conduction loss ratio (I.E. $Q_G/R_{SS-ON}$) for the GaN HEMT native 4QS is two times lower than for a GaN 4QS constructed from two conventional uni-directional GaN HEMT devices due to the 2:1 die area per switch difference (only one gate is switched at any time).

With any GaN HEMT device it is important to ensure the silicon substrate that the HEMT device is built upon is kept connected to an appropriate voltage reference. For a conventional unidirectional GaN HEMT device the appropriate voltage for the substrate to be biased to is a voltage close to the source terminal voltage. This is easily achieved in the case of a unidirectional GaN HEMT device by simply connecting the substrate to the source connection. With a GaN HEMT bidirectional switch (BDS or 4QS) the appropriate voltage to reference the substrate to is the source terminal with the lowest potential—this means that the substrate in a GaN HEMT 4QS device needs some form of circuitry to bias the voltage to the correct source potential.

The impact of not correctly biasing the GaN HEMT 4QS substrate to the correct voltage is detrimental to the operation of the device and leads to non-optimal switching characteristics, e.g., substrate bias impacts both transient switching characteristics and on-state characteristics. Previous substrate bias control solutions include the use of passive circuits. In one example, a passive circuit comprising an arrangement of diodes and resistors is couple across the GaN transistor pair. The circuit ensures that the substrate bias voltage cannot rise above a threshold level established by the diodes; however, such a circuit does not prevent the substrate bias from falling to a low level or even becoming a negative voltage. Such variability of the substrate bias is detrimental to the proper operation of the bidirectional GaN HEMT switch.

Therefore, there is a need in the art for an improved substrate bias management circuit for a four quadrant bi-directional switch.

SUMMARY

In accordance with at least some embodiments of the present disclosure, an apparatus for performing substrate voltage management comprises an active substrate voltage management circuit configured to be coupled to a substrate of a bidirectional gallium nitride high electron mobility transistor comprising a first source and a second source, wherein the active substrate voltage management circuit comprises a first circuit that is connected to the first source and a second circuit that is connected to a second source such that when the bidirectional gallium nitride high electron mobility transistor is operational one of the first circuit or the second circuit connects one of the first source to the substrate or the second source to the substrate, respectively, to control a bias voltage applied to the substrate.

In accordance with at least some embodiments of the present disclosure, a method of performing substrate voltage management comprises operating a bidirectional gallium nitride high electron mobility transistor comprising a first source and a second source and operating an active substrate voltage management circuit comprising a first circuit that is connected to a first source and a second circuit that is connected to a second source such that when the bidirectional gallium nitride high electron mobility transistor is operational one of the first circuit or the second circuit connects one of the first source to the substrate or the second source to the substrate, respectively, to control a bias voltage applied to the substrate.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to substrate voltage management circuits for bi-directional GaN HEMT switches. For example, apparatus for performing substrate voltage management can comprise an active substrate voltage management circuit configured to be coupled to a substrate of a bidirectional gallium nitride high electron mobility transistor comprising a first source and a second source. For example, in at least some embodiments, the active substrate voltage management circuit comprises a first circuit that is connected to the first source and a second circuit that is connected to a second source. In at least some embodiments, when the bidirectional gallium nitride high electron mobility transistor is changing state from one of on to off or off to on one of the first circuit or the second circuit connects one of the first source to the substrate or the second source to the substrate, respectively, to control a bias voltage applied to the substrate. The apparatus and methods described herein provide improved switching performance and reliability of the GaN HEMT bidirectional switch. Additionally, the GaN HEMT bidirectional switch described herein has a 4× die area advantage when compared to conventional unidirectional GaN HEMT devices, which, in turn, can provide a 4× cost advantage to a manufacturer.

Figure 1:
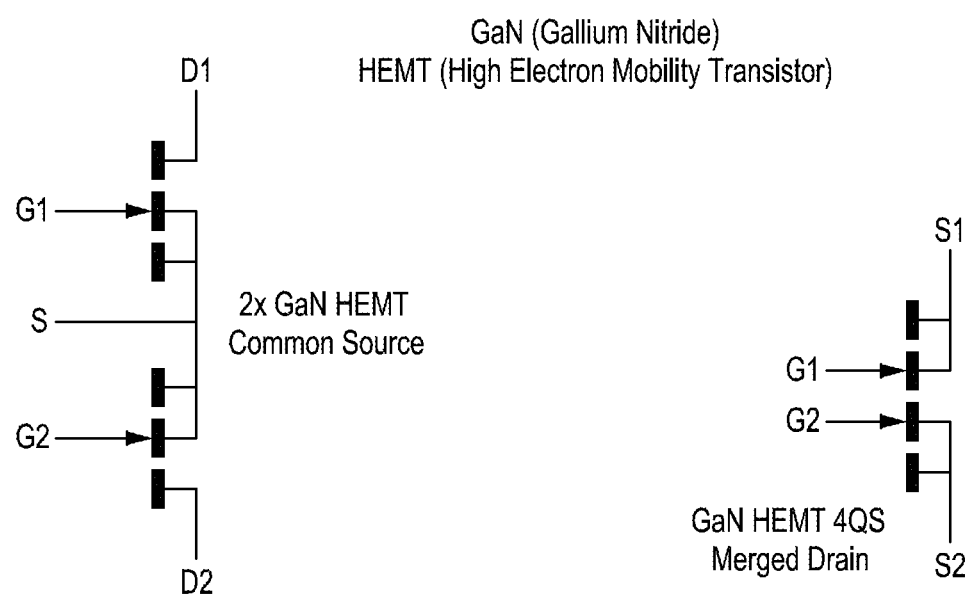
FIG. 1 is a schematic diagram of a GaN HEMT in a common source configuration and in a 4QS merged drain configuration.
Figure 2:
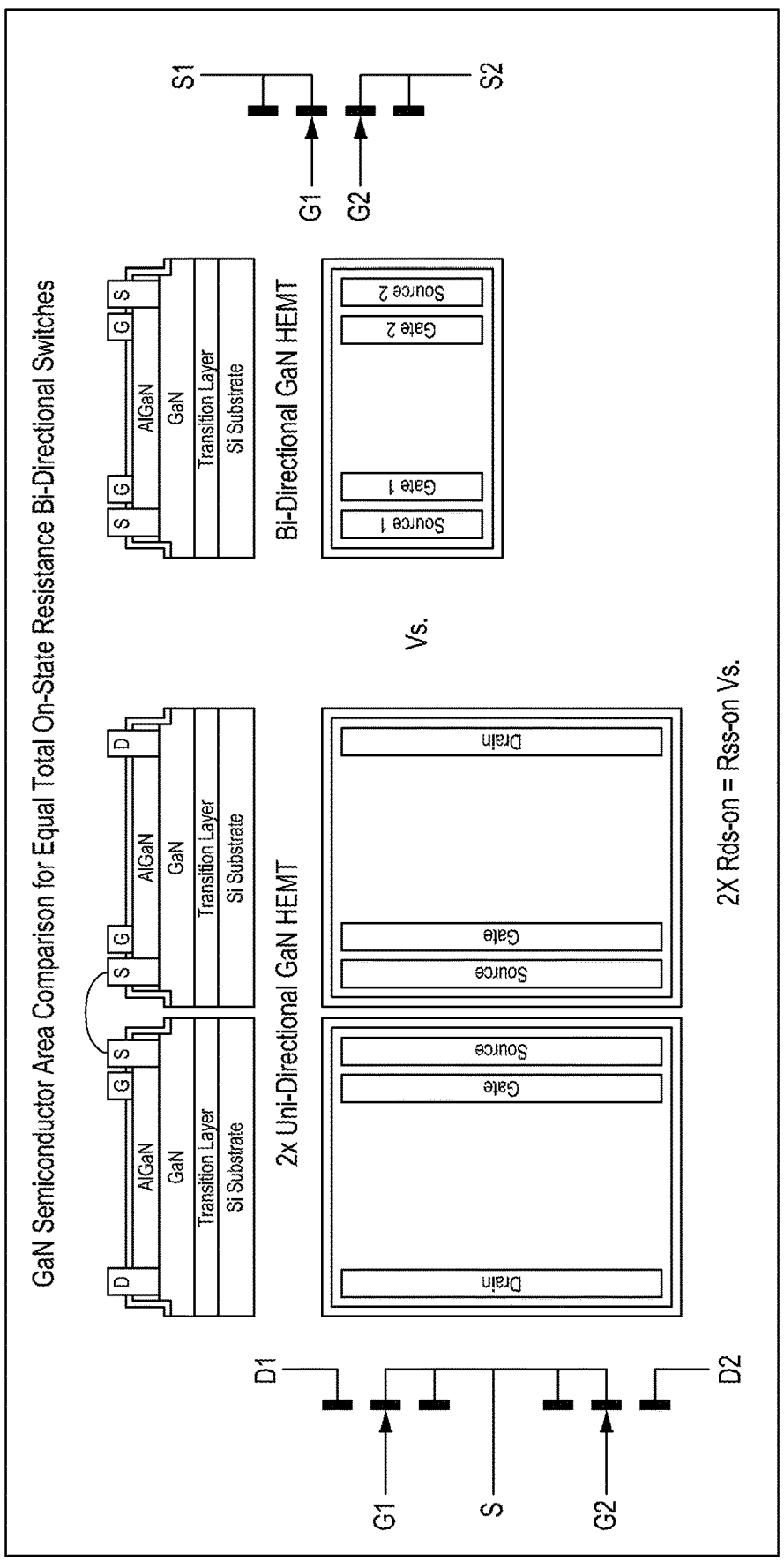
FIG. 2 is a cross-section and top plan view of a GaN HEMT in a common source configuration and in a 4QS merged drain configuration.
Figure 3:
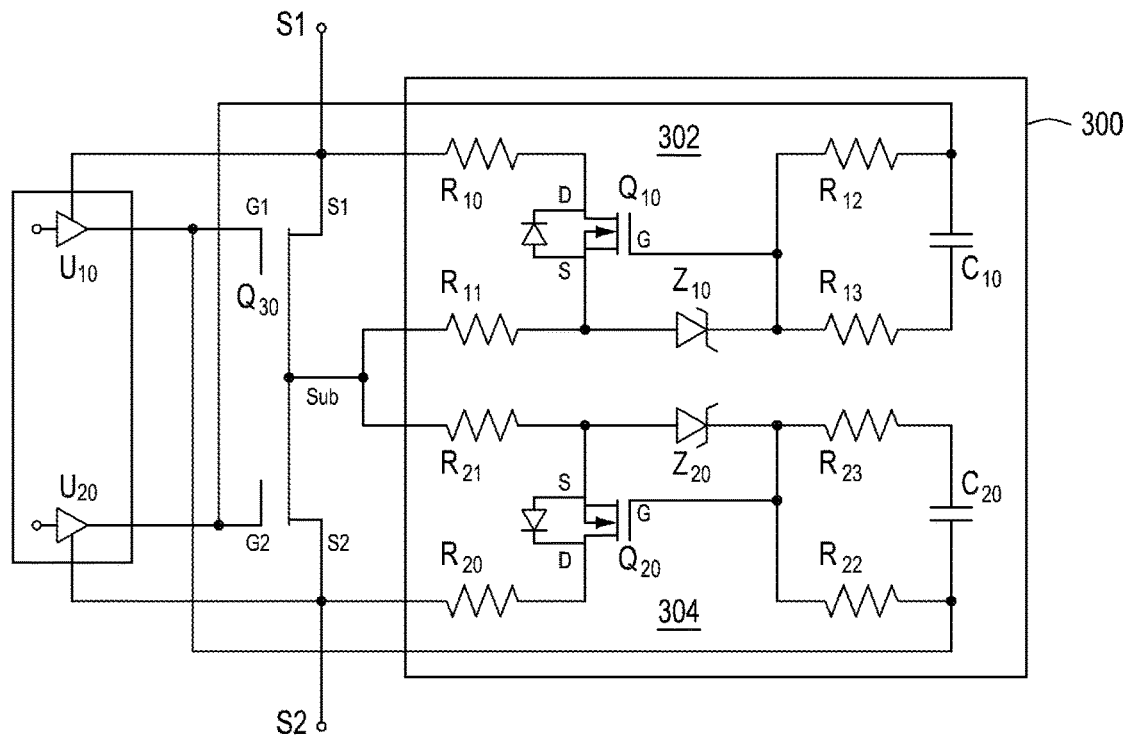
FIG. 3 is a schematic diagram of a substrate voltage management circuit in accordance with one or more embodiments of the present disclosure.

FIG. 3 is a schematic diagram of a substrate voltage management circuit 300 in accordance with one or more embodiments of the present disclosure. The GaN HEMT 4QS (e.g., the Q30 device) has five physical connections: a Gate-1 (G1), Source-1 (S1), Substrate (Sub), Gate-2 (G2), and Source-2 (S2). Two gate drive buffers (U10 & U20) are external gate drive buffers that are configured for applying a required gate turn-on voltage (e.g., about 5V) for the Q30 device.

The substrate voltage management circuit 300 comprises one or more resistors, one or more capacitors, one or more Zener diodes, and one or more transistors. For example, in at least some embodiments, the substrate voltage management circuit 300 comprises eight resistors (R10 to R13 & R20 to R23), two capacitors (C10 & C20), two Zener diodes (Z10 & Z20), and two transistors (Q10 & Q20). The substrate voltage management circuit 300 comprises two identical circuits. For example, in at least some embodiments, the substrate voltage management circuit 300 comprises a first circuit 302 and a second circuit 304. The first circuit 302 comprises resistors R10 to R13, transistor Q10, capacitor C10, and Zener diode Z10, all of which are connected/associated with the G1/S1 side of the Q30 device. Likewise, the second circuit 304 comprises resistors R20 to R23, transistor Q20, capacitor C20, and Zener diode Z20, all of which are connected/associated with the G2/S2 side of the Q30 device.

The transistor Q10 and the transistor Q20 of the active substrate voltage management circuit 300 are configured as two active switches and can be, for example, N-channel MOSFETs, N-channel JFETs, or GaN HEMT devices. In at least some embodiments, transistor Q10 and the transistor Q20 can be N-channel MOSFETs.

The Substrate (Sub) of the Q30 device may be connected to S1 (and to S2) by turning the Gate (G) of Q10 (or the Gate G of Q20) on. Q10 (Q20) connects the Substrate (Sub) of the Q30 device to S1 (S2) via two resistors R10 (R20) and R11 (R21). A sum impedance of the two resistors R10+R11 (R20+R21) determines the impedance that connects the Substrate (Sub) to S1 (S2). The resistor R11 (R21) facilitates a current limit function that can allow a peak current that flows through Q10 (Q20) to be set, which can function to protect the transistor Q10 (Q20) from an overcurrent situation that could result from a shoot-through condition (e.g., if Q10 & Q20 are both on together when the Q30 device is not actually conducting). Adding the current limit function makes the substrate voltage management circuit 300 robust and an immune to noise that could trigger a brief shoot-through condition during a dynamic state change condition for the Q30 device (e.g., on to off, or off to on).

A gate threshold voltage for Q10 (Q20) divided by a resistance of R11 (R21) determines a current limit value through Q10 (Q20). If additional impedance beyond a value of R11 (R21) is required in the path from the Substrate (Sub) to S1 (S2), resistance values for R10 (R20) can be chosen accordingly.

The Zener diode Z10 (Z20) is used to limit a maximum gate voltage applied across the gate-to-source for Q10 (gate-to-source for Q20). In at least some embodiments, the Zener diode has a regulation voltage that is greater than the Q10 (Q20) gate threshold voltage and less than a maximum allowed gate voltage. In at least some embodiments, e.g., if Q10 (Q20) is a JFET device, the Zener diode can be omitted.

The Q10 (Q20) gate is driven by a gate drive network comprising the two resistors R12 & R13 (R22 & R23) and a capacitor C10 (C20) from the opposite gate G2 (G1) of the Q30 device. The value of resistor R12 (R22) is chosen to determine the static gate drive current for Q10 (Q20), whereas the value of resistor R13 (R23) and the value of the capacitor C10 (C20) are chosen to determine the dynamic gate drive current for Q10 (Q20).

When the Q30 device is turned off a voltage polarity that the Q30 device blocks determines which of the transistors Q10 or Q20 is turned on. For example, when (if) the voltage on S1 (S2) is greater than the voltage on S2 (S1), the transistor Q20 (Q10) will be turned on, which connects the Substrate (Sub) to S2 (S1). While the Q30 device is off, the gate drive current for Q10 (Q20) is provided by the static gate resistor R12 (R22) and, since the voltage being blocked by the Q30 device can be as high as several hundred volts, the value of the static gate drive resistor R12 (R22) can be a high impedance (e.g., several hundred thousand ohms) to reduce a gate drive power dissipation.

Similarly, when the Q30 device is turned on, both of the transistors Q10 and Q20 are turned on. Thus, the substrate voltage management circuit 300 connects the Substrate (Sub) to both S1 and S2, e.g., the voltage at S1 and S2 are equal, as the Q30 device connects S1 to S2. Additionally, while the Q30 device is ON, the gate drive current for Q10 (Q20) is provided by the static gate resistor R12 (R22). Since the resistance of the static gate drive resistors R12

(R22) is a high impedance (e.g., several hundred thousand ohms) and the gate drive voltage is typically about 5V, the Gate current provided to Q10 and Q20 will be very low.

Likewise, when the Q30 device is dynamically changing state, e.g., on to off or off to on, the changing voltage (dv/dt) across the Q30 device S1-to-S2 enables a higher gate current for Q10 (Q20) to be generated. The higher gate current can be determined by the rate of change of the voltage across the Q30 device (S1-to-S2 dv/dt), and the values of the dynamic gate drive resistor R13 (R23) and the dynamic gate drive capacitor C10 (C20).

In operation, the Substrate (Sub) voltage is driven by capacitive displacement currents that flow from the Substrate (Sub) to S1 (S2) during dynamic switching conditions, e.g., when the Q30 device either turns on or turns off. Thus, the dynamic gate drive circuit R13 & C10 (R23 & C20) effectively provides more (e.g., the most) of the practical functioning gate drive current for Q10 (Q20). The static gate drive resistor R12 (R22) provides less (e.g., the least) of the practical functioning gate drive current for Q10 (Q20).

In at least some embodiments, the substrate voltage management circuit 300 can be implemented (formed) using discrete components or the substrate voltage management circuit 300 can be integrated in a semiconductor chip (e.g., in either a silicon layer or GaN layer). When the substrate voltage management circuit 300 is integrated in the GaN layer, the entire substrate voltage management circuit 300 can be monolithically integrated into the same die as the Q30 device.

Figure 4:
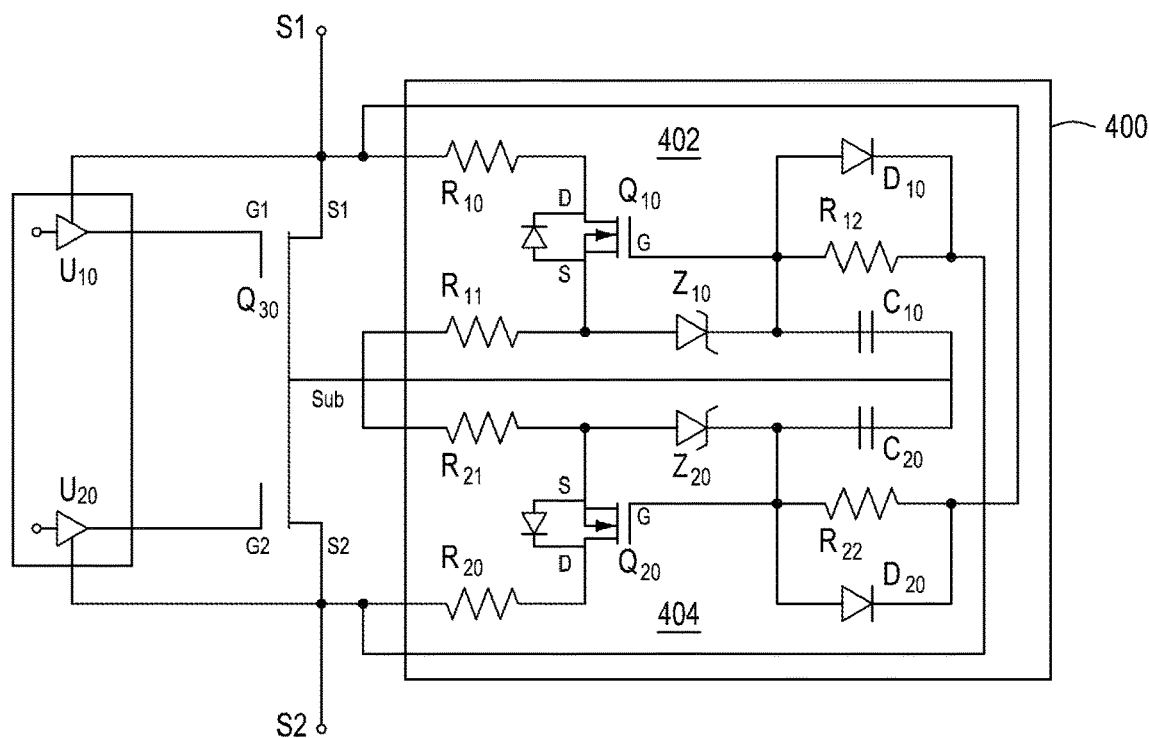
FIG. 4 is a schematic diagram of a substrate voltage management circuit in accordance with one or more alternate embodiments of the present disclosure.

FIG. 4 depicts an alternate embodiment of a substrate voltage management circuit 400 in accordance with one or more embodiments of the present disclosure. The substrate voltage management circuit 400 is substantially identical to the substrate voltage management circuit 300. Accordingly, only those features that are unique to the substrate voltage management circuit 400 are described herein. The substrate voltage management circuit 400 can comprise six resistors (R10 to R12 & R20 to R22), two capacitors (C10 & C20), two Zener diodes (Z10 & Z20), two diodes (D10 & D20), and two transistors (Q10 & Q20). The substrate voltage management circuit comprises a first circuit 402 and a second circuit 404 (e.g., two identical circuits).

The Substrate (Sub) of the Q30 device can be connected to S1 (S2) by turning the gate (G) of Q10 (Q20) on. The Q10 (Q20) connects the Substrate (Sub) of Q30 to S1 (S2) via the two resistors R10 (R20) and R11 (R21). The sum impedance of these two resistors R10+R11 (R20+R21) determines the impedance that connects the Substrate (Sub) to S1 (S2). The resistor R11 (R21) facilitates a current limit function that can allow the peak current that flows through Q10 (Q20) to be set, which can be used to protect the transistor Q10 (Q20) from an overcurrent situation that could result from a shoot-through condition (if Q10 & Q20 are both on together when the Q30 device is not actually conducting). Adding the current limit function makes the substrate voltage management circuit 300 robust and an immune to noise that could trigger a brief shoot-through condition during a dynamic state change condition for the Q30 device (e.g., on to off, or off to on).

A gate threshold voltage for Q10 (Q20) divided by a resistance of R11 (R21) determines a current limit value through Q10 (Q20). If additional impedance beyond a value of R11 (R21) is required in the path from the Substrate (Sub) to S1 (S2), resistance values for R10 (R20) can be chosen accordingly.

The Zener diode Z10 (Z20) is used to limit a maximum gate voltage applied across the gate-to-source for Q10 (gate-to-source for Q20). In at least some embodiments, the Zener diode has a regulation voltage that is greater than the Q10 (Q20) gate threshold voltage and less than a maximum allowed gate voltage. In at least some embodiments, e.g., if Q10 (Q20) is a JFET device, the Zener diode can be omitted.

The Q10 (Q20) gate is driven by a gate drive network consisting of a resistor R12 (R22), a diode D10 (D20) and a capacitor C10 (C20) from the opposite S2 (S1) of the Q30 device. The value of resistor R12 (R22) is chosen to determine the static gate drive current for Q10 (Q20), whereas the value of the capacitor C10 (C20) is chosen to determine the time period that Q10 (Q20) will remain turned on once the Q30 device is turned on.

When the GaN HEMT the Q30 device is turned off a voltage polarity that the Q30 blocks determines which of the transistors Q10 or Q20 is turned on. When (if) the voltage on S1 (S2) is greater than the voltage on S2 (S1), the transistor Q20 (Q10) will be turned on which will connect the Substrate (Sub) to S2 (S1). While the Q30 device is off, the gate drive current for Q10 (Q20) is provided by the static gate resistor R12 (R22), and since the voltage being blocked by the Q30 device can be as high as several hundred volts, the value of the static gate drive resistor R12 (R22) can be a high impedance (e.g., several hundred thousand ohms) to reduce the gate drive power dissipation.

Similarly, when the Q30 device starts to turn on, the transistor Q10 (or Q20) that was previously turned on (e.g., during the Q30 off state) will remain turned on due to a charge on the capacitor C10 (or C20), which ensures that the substrate voltage management circuit 400 connects the Substrate (Sub) to the correct source connection S1 (or S2). When the Q30 device totally turns on, the charge on the capacitor C10 (C20) will be discharged through the diode D10 (D20)—at such time neither Q10 or Q20 will be turned on, and the Substrate (Sub) will not be actively clamped to either S1 or S2; however, the voltage of the Substrate (Sub) will be biased to the correct Source voltage prior to the Q30 device finally turning on.

During the remaining period that the Q30 device remains turned on, if there is some capacitively coupled displacement current that tries to bias the Substrate (Sub) to a negative value, a gate-to-source voltage is established on the transistors Q10 and Q20, which, in turn, turns on the transistors Q10 and Q20 and connects the Substrate (Sub) to Sources S1 & S2. Accordingly, the Substrate (Sub) voltage is not able to get biased to any potential less than the Gate threshold voltage for transistors Q10 & Q20 (e.g., about 4V).

Figure 5:
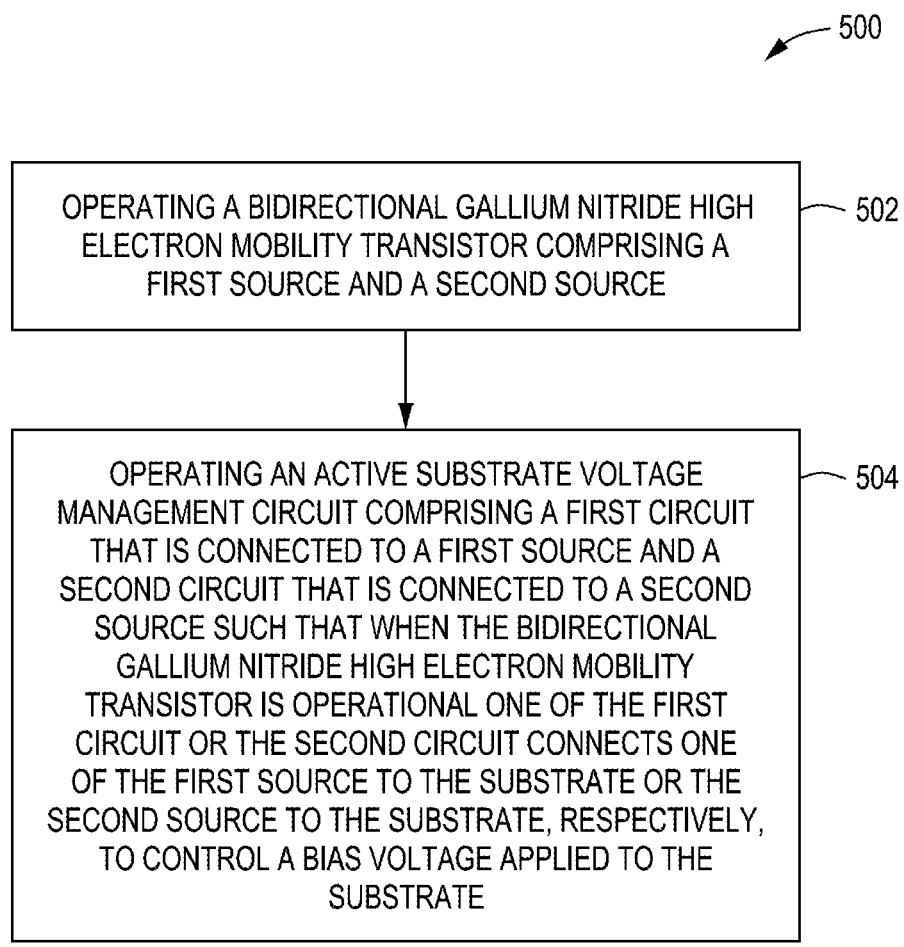
FIG. 5 is a flowchart of a method of performing substrate voltage management in accordance with one or more alternate embodiments of the present disclosure.

FIG. 5 is a flowchart of a method 500 of performing substrate voltage management in accordance with one or more alternate embodiments of the present disclosure. The method 500 can be implemented using either the substrate voltage management circuit 300 or the substrate voltage management circuit 400. For illustrative purposes, the method 500 is described herein using the substrate voltage management circuit 300.

For example, at 502, the method 500 comprises operating a bidirectional gallium nitride high electron mobility transistor comprising a first source and a second source. For example, in at least some embodiments, the Q30 device comprising S1 and S2 can be operational when being used in conjunction with a power conversion system that comprises a DC component, such as a PV module or a battery, coupled to a DC side of a switched mode power converter, and a controller that controls operation of the power conversion system. One such power conversion system is disclosed in commonly-owned U.S. patent application Ser. No.

17/842,459, filed Jun. 16, 2022, the entire contents of which is incorporated herein by reference.

Next, at 504, the method 500 comprises operating an active substrate voltage management circuit comprising a first circuit that is connected to a first source and a second circuit that is connected to a second source such that when the bidirectional gallium nitride high electron mobility transistor is operational one of the first circuit or the second circuit connects one of the first source to the substrate or the second source to the substrate, respectively, to control a bias voltage applied to the substrate.

For example, in at least some embodiments, as noted above, when the Q30 device is turned off a voltage polarity that the Q30 device blocks determines which of the transistors Q10 or Q20 is turned on. For example, when (if) the voltage on S1 (S2) is greater than the voltage on S2 (S1), the transistor Q20 (Q10) will be turned on, which connects the Substrate (Sub) to S2 (S1). While the Q30 device is off), the gate drive current for Q10 (Q20) is provided by the static gate resistor R12 (R22) and, since the voltage being blocked by the Q30 device can be as high as several hundred volts, the value of the static gate drive resistor R12 (R22) can be a high impedance (e.g., several hundred thousand ohms) to reduce a gate drive power dissipation.

Similarly, when the Q30 device is turned on, both of the transistors Q10 and Q20 are turned on. Thus, the substrate voltage management circuit 300 connects the Substrate (Sub) to both S1 and S2, e.g., the voltage at S1 and S2 are equal, as the Q30 device connects S1 to S2. Additionally, while the Q30 device is ON, the gate drive current for Q10 (Q20) is provided by the static gate resistor R12 (R22). Since the resistance of the static gate drive resistors R12 (R22) is a high impedance (e.g., several hundred thousand ohms) and the gate drive voltage is typically about 5V, the Gate current provided to Q10 and Q20 will be very low.

Likewise, when the Q30 device is dynamically changing state, e.g., on to off or off to on, the changing voltage (dv/dt) across the Q30 device S1-to-S2 enables a higher gate current for Q10 (Q20) to be generated. The higher gate current can be determined by the rate of change of the voltage across the Q30 device (S1-to-S2 dv/dt), and the values of the dynamic gate drive resistor R13 (R23) and the dynamic gate drive capacitor C10 (C20). As further noted above, the Substrate (Sub) voltage is driven by capacitive displacement currents that flow from the Substrate (Sub) to S1 (S2) during dynamic switching conditions, e.g., when the Q30 device either turns on or turns off. Thus, the dynamic gate drive circuit R13 & C10 (R23 & C20) effectively provides more (e.g., the most) of the practical functioning gate drive current for Q10 (Q20). The static gate drive resistor R12 (R22) provides less (e.g., the least) of the practical functioning gate drive current for Q10 (Q20).

Additionally, at 504, when the substrate voltage management circuit 400 is used, when the Q30 device totally turns on, the charge on the capacitor C10 (C20) will be discharged through the diode D10 (D20)—at such time neither Q10 or Q20 will be turned on, and the Substrate (Sub) will not be actively clamped to either S1 or S2; however, the voltage of the Substrate (Sub) will be biased to the correct Source voltage prior to the Q30 device finally turning on.

The foregoing description of embodiments of the disclosure comprises a number of elements, devices, circuits and/or assemblies that perform various functions as described. These elements, devices, circuits, and/or assemblies are exemplary implementations of means for performing their respectively described functions.

While the foregoing is directed to embodiments of the present disclosure, other and further embodiments of the disclosure may be devised without departing from the basic scope thereof, and the scope thereof is determined by the claims that follow.

The invention claimed is:

1. Apparatus for performing substrate voltage management, comprising:
   an active substrate voltage management circuit configured to be coupled to a substrate of a bidirectional gallium nitride high electron mobility transistor comprising a first source and a second source,
   wherein the active substrate voltage management circuit comprises a first circuit that is connected to the first source and a second circuit that is connected to the second source such that when the bidirectional gallium nitride high electron mobility transistor is operational one of the first circuit or the second circuit connects one of the first source to the substrate or the second source to the substrate, respectively, to control a bias voltage applied to the substrate, and
   wherein a first resistor of the first circuit and a second resistor of the second circuit are connected in parallel to each other and the substrate to protect a first transistor of the first circuit and a second transistor of the second circuit from an overcurrent situation when the first transistor and the second transistor are both on together and when the bidirectional gallium nitride high electron mobility transistor device is not.

2. The apparatus of claim 1, wherein when the bidirectional gallium nitride high electron mobility transistor is turned off and a voltage on the first source is greater than a voltage on the second source, a transistor of the second circuit is turned on, which connects the substrate to the second source, and vice versa.

3. The apparatus of claim 1, wherein when the bidirectional gallium nitride high electron mobility transistor is turned on, corresponding transistors of the first circuit and the second circuit are turned on, such that the substrate is connected to both the first source and the second source.

4. The apparatus of claim 1, wherein, when the bidirectional gallium nitride high electron mobility transistor is dynamically changing state from on to off or off to on, a changing voltage (dv/dt) across first source and the second source enables a higher gate current for corresponding transistors of the first circuit and the second circuit to be generated.

5. The apparatus of claim 1, wherein the first circuit and the second circuit are identical.

6. The apparatus of claim 1, wherein the first circuit and the second circuit each comprises:
   three additional resistors;
   a capacitor;
   a Zener diode; and
   a transistor.

7. The apparatus of claim 6, wherein the transistor is at least one of an N-channel MOSFET or an N-channel JFET.

8. The apparatus of claim 6, wherein a sum of at least two resistors determines an impedance that connects to one of the first source or the second source.

9. The apparatus of claim 6, wherein the Zener diode is connected to a source of the transistor to limit a maximum gate voltage applied across a gate of the transistor and the source, and
   wherein the Zener diode has a regulation voltage that is greater than a gate threshold voltage and less than the maximum gate voltage.

10. The apparatus of claim 1, wherein the active substrate voltage management circuit is one of formed using discrete components or integrated into at least one of a silicon layer or a gallium nitride layer of the bidirectional gallium nitride high electron mobility transistor.

11. A method of performing substrate voltage management, comprising:
operating a bidirectional gallium nitride high electron mobility transistor comprising a first source and a second source; and
operating an active substrate voltage management circuit comprising a first circuit that is connected to the first source and a second circuit that is connected to the second source such that when the bidirectional gallium nitride high electron mobility transistor is operational one of the first circuit or the second circuit connects one of the first source to a substrate or the second source to the substrate, respectively, to control a bias voltage applied to the substrate,
wherein a first resistor of the first circuit and a second resistor of the second circuit are connected in parallel to each other and the substrate to protect a first transistor of the first circuit and a second transistor of the second circuit from an overcurrent situation when the first transistor and the second transistor are both on together and when the bidirectional gallium nitride high electron mobility transistor device is not.

12. The method of claim 11, wherein when the bidirectional gallium nitride high electron mobility transistor is turned off and a voltage on the first source is greater than a voltage on the second source, further comprising turning on a transistor of the second circuit, which connects the substrate to the second source, and vice versa.

13. The method of claim 11, wherein when the bidirectional gallium nitride high electron mobility transistor is turned on, further comprising turning on corresponding transistors of the first circuit and the second circuit, such that the substrate is connected to both the first source and the second source.

14. The method of claim 11, wherein, when the bidirectional gallium nitride high electron mobility transistor is dynamically changing state from on to off or off to on, a changing voltage (dv/dt) across first source and the second source enables a higher gate current for corresponding transistors of the first circuit and the second circuit to be generated.

15. The method of claim 11, wherein the first circuit and the second circuit are identical.

16. The method of claim 11, wherein the first circuit and the second circuit each comprises:
three additional resistors;
a capacitor;
a Zener diode; and
a transistor.

17. The method of claim 16, further comprising using at least one of an N-channel MOSFET or an N-channel JFET.

18. The method of claim 16, further comprising using a sum of at least two resistors to determine an impedance that connects to one of the first source or the second source.

19. The method of claim 16, further comprising using the Zener diode, which is connected to a source of the transistor, to limit a maximum gate voltage applied across a gate of the transistor and the source, and
wherein the Zener diode has a regulation voltage that is greater than a gate threshold voltage and less than the maximum gate voltage.

20. The method of claim 11, wherein the active substrate voltage management circuit is one of formed using discrete components or integrated into at least one of a silicon layer or a gallium nitride layer of the bidirectional gallium nitride high electron mobility transistor.

* * * * *